(12) United States Patent
Kuo et al.

(10) Patent No.: US 11,444,032 B2
(45) Date of Patent: Sep. 13, 2022

(54) SEMICONDUCTOR PACKAGE DEVICE AND METHOD FOR MANUFACTURING THE SAME

(71) Applicant: Advanced Semiconductor Engineering, Inc., Kaohsiung (TW)

(72) Inventors: Yencheng Kuo, Kaohsiung (TW); Shao-Lun Yang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 17 days.

(21) Appl. No.: 16/917,335

(22) Filed: Jun. 30, 2020

(65) Prior Publication Data

US 2021/0407910 A1    Dec. 30, 2021

(51) Int. Cl.
| | |
|---|---|
| *H01L 23/538* | (2006.01) |
| *H01L 23/00* | (2006.01) |
| *H01L 21/48* | (2006.01) |
| *H01L 23/498* | (2006.01) |
| *B81B 7/00* | (2006.01) |
| *H01L 25/16* | (2006.01) |

(52) U.S. Cl.
CPC ........ *H01L 23/5384* (2013.01); *B81B 7/0074* (2013.01); *H01L 21/486* (2013.01); *H01L 23/49838* (2013.01); *H01L 24/45* (2013.01); *H01L 25/16* (2013.01); *H01L 2924/1461* (2013.01)

(58) Field of Classification Search
CPC .............. H01L 23/5384; H01L 21/486; H01L 21/49838
See application file for complete search history.

(56) References Cited

U.S. PATENT DOCUMENTS

| | | | |
|---|---|---|---|
| 2010/0087024 A1* | 4/2010 | Hawat | H01L 21/52 438/51 |
| 2010/0221860 A1* | 9/2010 | Hawat | B81B 7/0074 438/51 |

* cited by examiner

Primary Examiner — Errol V Fernandes
(74) Attorney, Agent, or Firm — Foley & Lardner LLP

(57) ABSTRACT

A semiconductor package device and a method of manufacturing a semiconductor package device are provided. The semiconductor package device includes a substrate, a first electronic component, a first dielectric layer, and a first hole. The substrate has a first surface and a second surface opposite to the first surface. The first electronic component is disposed on the first surface. The first dielectric layer is disposed on the second surface and has a third surface away from the substrate. The first hole extends from the first dielectric layer and the substrate. The first hole is substantially aligned with the first electronic component.

13 Claims, 18 Drawing Sheets

SEMICONDUCTOR PACKAGE DEVICE AND METHOD FOR MANUFACTURING THE SAME

BACKGROUND

1. Field of the Disclosure

The present disclosure relates to a semiconductor package device and a method for manufacturing the same, and to a semiconductor package device including an electronic component, and a method for manufacturing the same.

2. Description of the Related Art

A semiconductor package device may include a substrate and multiple devices attached thereto. The substrate may have a through hole facilitating external signal receiving of one of the devices. The through hole, however, limits the selection of subsequent manufacturing operations since the through hole itself may become a channel for device contamination. In some techniques, a plastic member may be attached to the substrate, having a through hole aligning with the through hole of the substrate so as to facilitate external signal receiving. However, it is difficult to identify a suitable adhesive to properly attach the plastic member to the substrate, and it is technically difficult to align the through hole of the substrate with the through hole of the plastic member within a tolerable range.

SUMMARY

In some embodiments, a semiconductor package device includes a substrate, a first electronic component, a first dielectric layer, and a first hole. The substrate has a first surface and a second surface opposite to the first surface. The first electronic component is disposed on the first surface. The first dielectric layer is disposed on the second surface and has a third surface away from the substrate. The first hole extends through the first dielectric layer and the substrate. The first hole is substantially aligned with the first electronic component.

In some embodiments, a semiconductor package device includes a substrate, a first microelectromechanical systems (MEMS) device, a second MEMS device, a first hole, and a second hole. The substrate has a first surface and a second surface opposite to the first surface. The first MEMS device is disposed on the first surface. The second MEMS device is disposed on the second surface. The first hole includes a first section extending through the substrate and is substantially aligned with the first MEMS device. The second hole extends through the substrate and is substantially aligned with the second MEMS device.

In some embodiments, a method of manufacturing a semiconductor package device, including: providing a substrate having a first surface and a second surface opposite to the first surface; forming a first dielectric layer on the second surface and the first dielectric layer having a third surface away from the substrate; forming a first hole extending from the third surface to the first surface; and disposing a first electronic component on the first surface. The first hole is substantially aligned with the first electronic component.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
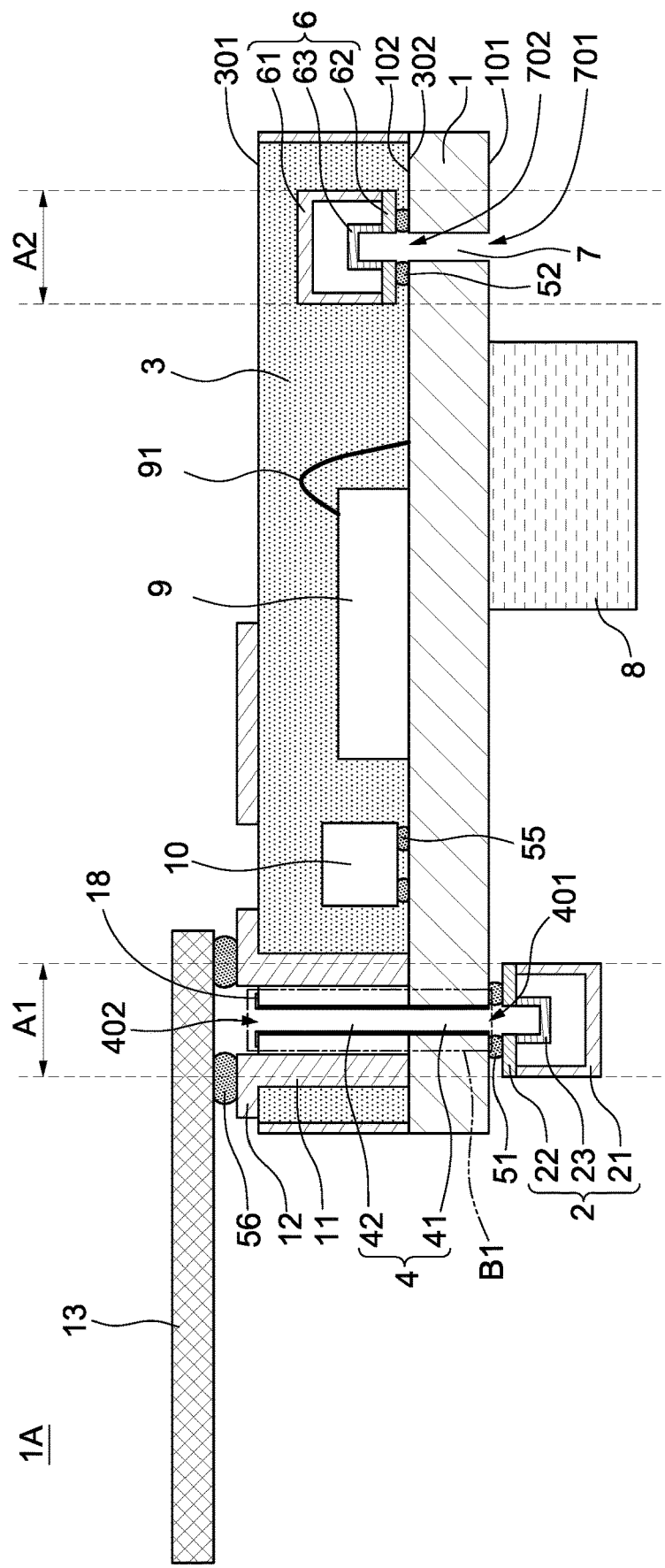
FIG. 1 illustrates a cross-sectional view of a semiconductor package device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure provides a semiconductor package device including a substrate, a first electronic component disposed on a surface of the substrate, and a dielectric layer disposed on another surface of the substrate. A first hole extends through the substrate and the dielectric layer and substantially aligns with the first electronic component, allowing the first electronic component to efficiently receive at least one signal therethrough. A reflection layer may be disposed along a sidewall of the first hole to reduce reflection loss during transmission of the physical signal. Furthermore, to reinforce the robustness of the semiconductor package device, the dielectric layer can firmly hold one or more relatively small devices disposed on the substrate. Consequently, a relatively small package size can be achieved. Furthermore, the first hole may be formed via a relatively inexpensive process, for example, mechanical drilling or laser ablation.

Additionally, the semiconductor package device may include a second electronic component disposed on the same side of the substrate as the dielectric layer. A second hole extends through the substrate and substantially aligns with the second electronic component. The second electronic component can efficiently receive at least one physical signal through the second hole. With such an arrangement, the first and second electronic components may individually receive at least one physical signal different from each other.

FIG. 1 illustrates a cross-sectional view of a semiconductor package device 1A according to some embodiments of the present disclosure. The semiconductor package device 1A includes a substrate 1, a first electronic component 2, a first dielectric layer 3, a first hole 4, a reflection layer 18, and a connection element 51.

The substrate 1 has a first surface 101 and a second surface 102 opposite to the first surface 101. The first electronic component 2 is disposed on the first surface 101. The connection element 51 is disposed between the first electronic component 2 and the first surface 101 of the substrate 1. The connection element 51 may electrically connect the first electronic component 2 to the substrate 1.

The substrate 1 may include, for example, a printed circuit board (PCB), such as a paper-based copper foil laminate, a composite copper foil laminate, or a polymer-impregnated glass-fiber-based copper foil laminate. The connection element 51 may include, for example but is not limited to, solder, adhesive (which may include a conductive adhesive (e.g. resin mixed with conductive particles)), or other suitable bonding material(s).

The first electronic component 2 includes a housing 21, a base 22, and an active side 23. The housing 21 is in contact with the base 22. The active side 23 is in contact with the base and surrounded by the housing 21. The active side 23 is configured to receive or detect at least one physical signal. In some embodiments, the active side 23 may include a membrane. The housing 21, the base 22, and the active side 23 may define a cavity to detect the variation of at least one physical signal. The first electronic component 2 is configured to receive or detect at least one physical signal from environment (e.g., sound, pressure, light, temperature, humidity, gas, and the like) and to convert the received physical signal to an electrical signal (e.g., for subsequent processing). As shown in FIG. 1, the first hole 4 is aligned with the first electronic component 2 so as to facilitate the receiving of the aforesaid physical signal by the first electronic component 2. In some embodiments, the first electronic component 2 may be a microelectromechanical systems (MEMS) device which includes, e.g., a pressure sensor, a microphone, a barometer, a thermometer, a hygrometer, a gas detector, or the like.

The first dielectric layer 3 is disposed on the second surface 102 of the substrate. The first dielectric layer 3 has a third surface 301 away from the substrate 1 and a fourth surface 302 toward the substrate 1. In some embodiments, the fourth surface 302 may be in contact with the second surface 102. The first dielectric layer 3 may include epoxy resin or other suitable mold material.

The first hole 4 extends through the substrate 1 and/or the first dielectric layer 3. The first hole 4 includes a first section 41 extending through the substrate 1 and a second section 42 extending through the first dielectric layer 3. The first hole 4 extends from the third surface 301 to the first surface 101. For example, the first hole 4 has a first end 401 adjacent to the first surface 101 and a second end 402 adjacent to the third surface 301. In some embodiments, the first end 401 is proximal to the active side 23 of the first electronic component 2. The second end 402 is distal from the active side 23 of the first electronic component 2. In some embodiments, the second end 402 may be exposed or covered by a protection layer with microporous material. The second end 402 of the first hole 4 is substantially aligned with the first electronic component 2, allowing the first electronic component 2 to efficiently receive or detect the physical signal through the first hole 4. Alternatively, the second end 402 may be positioned facing the at least one external signal source in order to facilitate transmission of the physical signal. The external signal source can be located over the third surface 301 or at the side surface of the dielectric layer 3. The external signal source can be located under the first surface 101 of the substrate 1. Multiple external signal sources may be simultaneously presented at the aforesaid locations.

In comparative embodiments, a semiconductor package device includes a substrate with a first hole, an electronic component disposed on a first side of a substrate, and a plastic member disposed on a second side opposite to the first side of the substrate. The plastic member includes a second hole aligned with the first, so the electronic component can receive external signals through the first and second holes. However, it is technically difficult to align the first hole and the second hole in the attachment process. Misalignment of the first and second holes can degrade transmission efficiency of the external signals. In the present disclosure, the first hole 4, which substantially aligns with the first electronic component 2 and extends through the substrate 1 and the first dielectric layer 3, provides an unimpeded transmission path for the physical signal and therefore improves transmission efficiency.

Furthermore, the first hole 4 may be formed by, for example, mechanical drilling or laser ablation, so the process cost is relatively less than forming a plastic member having a hole.

Figure 2A:
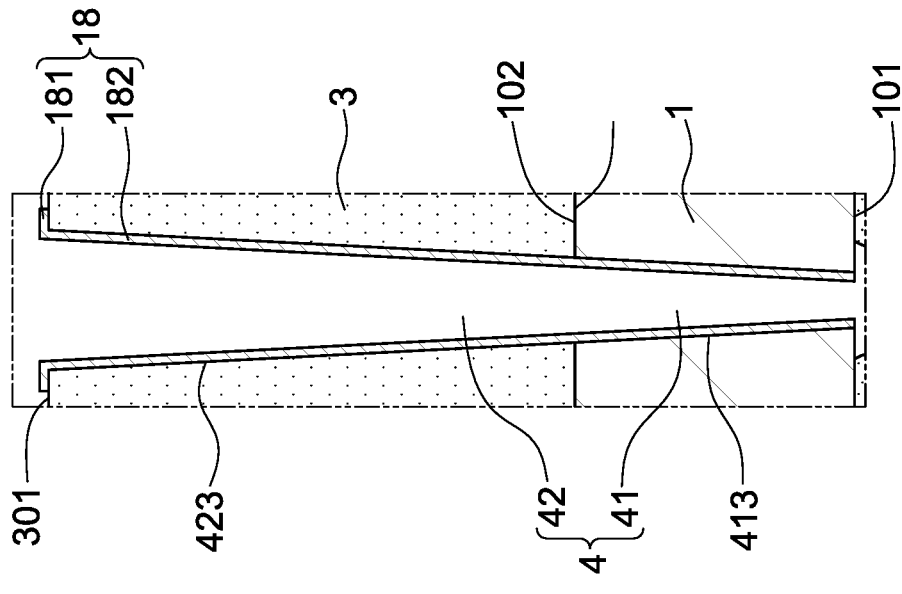
FIG. 2A illustrates an enlarged view of a dotted box B1 as shown in FIG. 1 according to some embodiments of the present disclosure.

As shown in FIG. 1, the reflection layer 18 is disposed on the first dielectric layer 3 and within the first hole 4. A detailed illustration of the reflection layer 18 appears in FIG. 2A. FIG. 2A illustrates an enlarged view of a dotted box B1 as shown in FIG. 1 according to some embodiments of the present disclosure. The first section 41 has a first sidewall 413 within the substrate 1. The second section 42 has a second sidewall 423 within the first dielectric layer 3. In some embodiments, the first sidewall 413 and the second sidewall 423 may be smoothly connected. In an alternative embodiment, the first sidewall 413 and the second sidewall 423 may form a discontinuous surface with one or more abrupt steps. In some embodiments, the first sidewall 413 has a substantially linear profile substantially perpendicular to the first surface 101 and/or the second surface 102. The second sidewall 423 has a substantially linear profile substantially perpendicular to the second surface 102 and the third surface 301. In some embodiments, the first hole 4 as illustrated in FIG. 2A may be formed in a mechanical drilling process. As shown in FIG. 2A, the reflection layer 18 includes a first portion 181 disposed on the third surface 301 of the first dielectric layer 3. The reflection layer 18 includes a second portion 182 disposed along the first sidewall 413 and/or the second sidewall 423. The reflection layer 18 may have a smooth surface. Hence, the reflection layer 18 reduces reflection loss during transmission of the physical signals through the first hole 4. In some embodiments, the reflection layer 18 may serve as a portion of an antenna in the semiconductor package device 1A.

The reflection layer 18 may include a seed layer in contact with the first dielectric layer 3. In an alternative embodiment, the reflection layer 18 may be free from a seed layer. The material of the reflection layer 18 may include metal, such as copper (Cu), gold (Au), aluminum (Al), titanium (Ti), or other suitable materials. In some embodiments, the material of the reflection layer 18 may include nonmetal. In some embodiments, the reflection layer 18 may be absent.

Figure 2B:
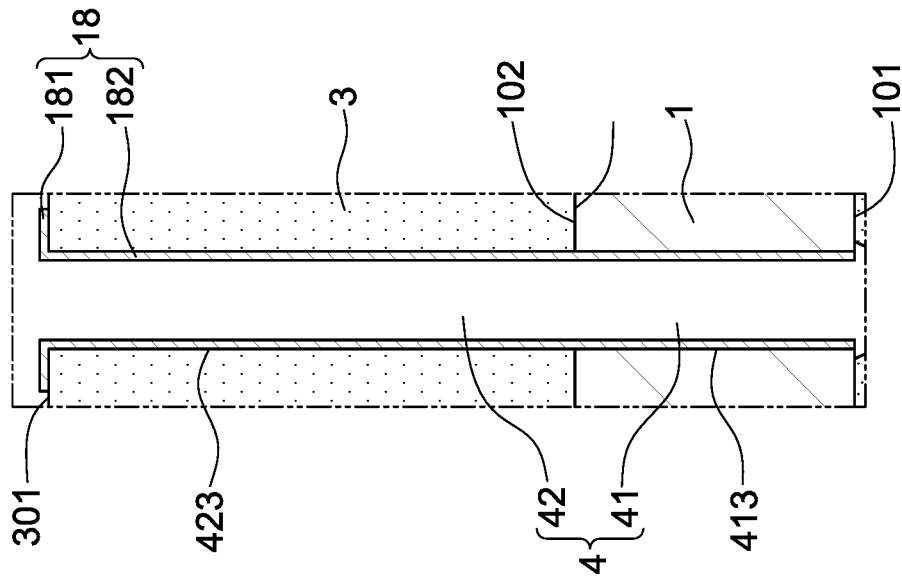
FIG. 2B illustrates an enlarged view of a dotted box B1 as shown in FIG. 1 according to some embodiments of the present disclosure.

FIG. 2B illustrates another enlarged view of the dotted box B1 as shown in FIG. 1 according to some embodiments of the present disclosure. The structure shown in FIG. 2B is similar to that in FIG. 2A, except that the first hole 4 has a tapered profile. In some embodiments, the first sidewall 413 has a substantially linear profile substantially inclined to the first surface 101 and/or the second surface 102. The second sidewall 423 has a substantially linear profile substantially inclined to the second surface 102 and the third surface 301. In some embodiments, the first sidewall 413 and the second sidewall 423 may be smoothly connected. In an alternative embodiment, the first sidewall 413 and the second sidewall 423 may form a discontinuous surface with one or more abrupt steps. In some embodiments, the first hole 4 as illustrated in FIG. 2B may be formed in a laser ablation process.

Again referring to FIG. 1, the semiconductor package device 1A further includes a semiconductor die 9, a bonding wire 91, a device 10, and a connection element 55. The semiconductor die 9 is disposed on the second surface 102 of the substrate 10. The semiconductor die 9 is electrically connected to the substrate 1 through the bonding wire 91, which is covered by the first dielectric layer 3. In some embodiments, the semiconductor die 9 may be electrically connected to the substrate 1 through multiple bonding wires. The device 10 is disposed on the second surface 102 of the substrate 1 through the connection element 55. The semiconductor die 9 and/or the device 10 are covered by the first dielectric layer 3. In addition to the attachment formed by the connection element 55, the first dielectric layer 3 helps firmly fix the device 10. As a result, the robustness of the semiconductor package device 1A is reinforced. Furthermore, with the reinforcement provided by the first dielectric layer 3, the size of the connection element 55 can be reduced and relatively small devices can be integrated into the semiconductor package device 1A, resulting in a relatively smaller package. Alternatively, small size devices, such as device 10, can be disposed on the same side as the first dielectric layer 3 and being encapsulated therein without occupying the opposite side of the substrate 1.

The semiconductor die 9 may include, for example, a processor, a controller (e.g. a memory controller), a memory die, a power device, or a high speed input/output device. The device 10 may include an active electrical component, such as a transistor or a diode. The device 10 may include a passive electrical component, such as a capacitor, a resistor or an inductor. The electrical connection between the device 10 and the substrate 1 may be attained by way of surface mount technology (SMT).

In some embodiments, the semiconductor die 9 may be disposed on the first surface 101 or the second surface 102 of the substrate 1 through a connection element. In some embodiments, multiple semiconductor die may be disposed on the first surface 101 or the second surface 102 of the substrate 1 through multiple connection elements.

Referring to FIG. 1, the semiconductor package device 1A further includes a second electronic component 6, a second hole 7, and a connection element 52. The second electronic component 6 is disposed on the second surface 102 of the substrate 1. The connection element 52 is disposed between the second electronic component 6 and the second surface 102 of the substrate 1. The connection element 52 may electrically connect the second electronic component 6 to the substrate 1. The second electronic component 6 is covered by the first dielectric layer 3. The first dielectric layer 3 helps firmly fix the second electronic component 6. The connection element 52 may be disposed on a metal layer of the substrate 1, which surrounds the second hole 7. The connection element 52 separates the second hole 7 from the first dielectric layer 3. In some embodiments, the connection element 52 can be composed of solder and contouring the boundary of the second hole 7 at the second end 702. For example, the connection element 52 may form a circular pattern, from a top view perspective, spacing between the first dielectric layer 3 and the second hole 7. If the connection element 52 does not completely space apart the first dielectric layer 3 and the second hole 7, a portion of the first dielectric layer 3 may enter the second hole 7 during the formation of the first dielectric layer 3, for example, via a molding operation, thereby deteriorating the transmission efficiency of at least one physical signal through the second hole 7.

The connection element 52 may include, for example but is not limited to, solder, adhesive (which may include a conductive adhesive (e.g. resin mixed with conductive particles)), or other suitable bonding material(s).

The second electronic component 6 includes a housing 61, a base 62, and an active side 63. The housing 61 is in contact with the base 62. The active side 63 is in contact with the base and is surrounded by the housing 61. The active side 63 is configured to receive or detect at least one signal. In some embodiments, the active side 63 may include a membrane. The housing 61, the base 62, and the active side 63 may define a cavity to detect the variation of at least one signal. The second electronic component 6 is configured to receive or detect at least one physical signal from environment (e.g., sound, pressure, light, temperature, humidity, gas, and the like) and to convert the received physical signal to an electrical signal (e.g., for subsequent processing). In some embodiments, the second electronic component 6 can be a MEMS device which may include, e.g., a pressure sensor, a microphone, a barometer, a thermometer, a hygrometer, a gas detector, or the like.

The second hole 7 extends through the substrate 1. The second hole 7 extends from the second surface 102 to the first surface 101. The second hole 7 has a first end 701 adjacent to the first surface 101 and a second end 702 adjacent to the second surface 102. The first end 701 is distal from the active side 63 of the second electronic component 6 and may be exposed or may be covered by a protection layer with microporous material. The second end 702 is proximal to the active side 63 of the second electronic component 6. The second hole 7 is substantially aligned with the second electronic component 6, allowing the second electronic component 6 to efficiently receive or detect the physical signal therethrough. Alternatively, the first end 701 may be positioned facing the at least one external signal source in order to facilitate transmission of the physical signal. The external signal source can be located under the first surface 101 of the substrate 1. Multiple external signal sources may be simultaneously presented at the aforesaid locations.

In some embodiments, a conductive layer may be disposed along a sidewall of the second hole 7 to reduce reflection loss during transmission of the physical signal.

The first electronic component 2 and the second electronic component 6 are disposed on different surfaces of the substrate 1. The first electronic component 2 has a first projected area A1 on the second surface 102 and the second electronic component 6 has a second projected area A2 on the second surface 102. The first projected area A1 and the second projected area A2 are separated. The first electronic component 2 and the second component 6 may receive or detect a same kind of physical signal but generated by different signal sources. For example, the first electronic component 2 and the first hole 4 are configured to receive an audio signal generated by the environment, whereas the second electronic component 6 and the second hole 7 are configured to receive an audio signal generated by a user for the semiconductor package device 1A.

In comparative embodiments, one or more electronic components are manually assembled to a flexible substrate appended to a PCB substrate together with other components such as battery, charger pins, speaker, etc., through multiple soldering operations at the assembly house. However, the cost of the aforesaid assembly is high and with low production throughput. In the present disclosure, the first electronic component 2 and the second component 6 are integrated with the substrate 1 of the semiconductor package device 1A, and hence no extra soldering operation is required, lowering the production cost and enhance the production throughput.

In some embodiments, the semiconductor package device 1A further includes an antenna 8 disposed on the first surface 101 of the substrate 1. The antenna 8 may be electrically connected to the substrate 1.

In some embodiments, the semiconductor package device 1A further includes a plurality of through vias 11, a conductive layer 12, a flexible substrate 13, and a connection element 56. The plurality of through vias 11 is disposed in the first dielectric layer 3. The plurality of through vias 11 extends from the third surface 301 to the fourth surface 302. The plurality of through vias 11 may electrically connect the substrate 1 at the second surface 302 of the first dielectric layer 3 and the conductive layer 12 at the first surface 301 of the first dielectric layer 3. In some embodiments, the through vias 11 allows electrical communication between the flexible substrate 13 and the first electronic component 2. The conductive layer 12 may include a conductive trace or a conductive pad. The material of the plurality of through vias 11 may include metal, such as copper (Cu), gold (Au), aluminum (Al), titanium (Ti), or other suitable materials. The material of the conductive layer 12 may include metal, such as copper (Cu), gold (Au), aluminum (Al), titanium (Ti), or other suitable materials.

The flexible substrate 13 is disposed on the first dielectric layer 13. The flexible substrate 13 is electrically connected to the conductive via 11 through the connection element 56 and the conductive layer 12. The flexible substrate 13 may include a plurality of conductive pads configured to electrically connect to other devices or packages.

Figure 3:
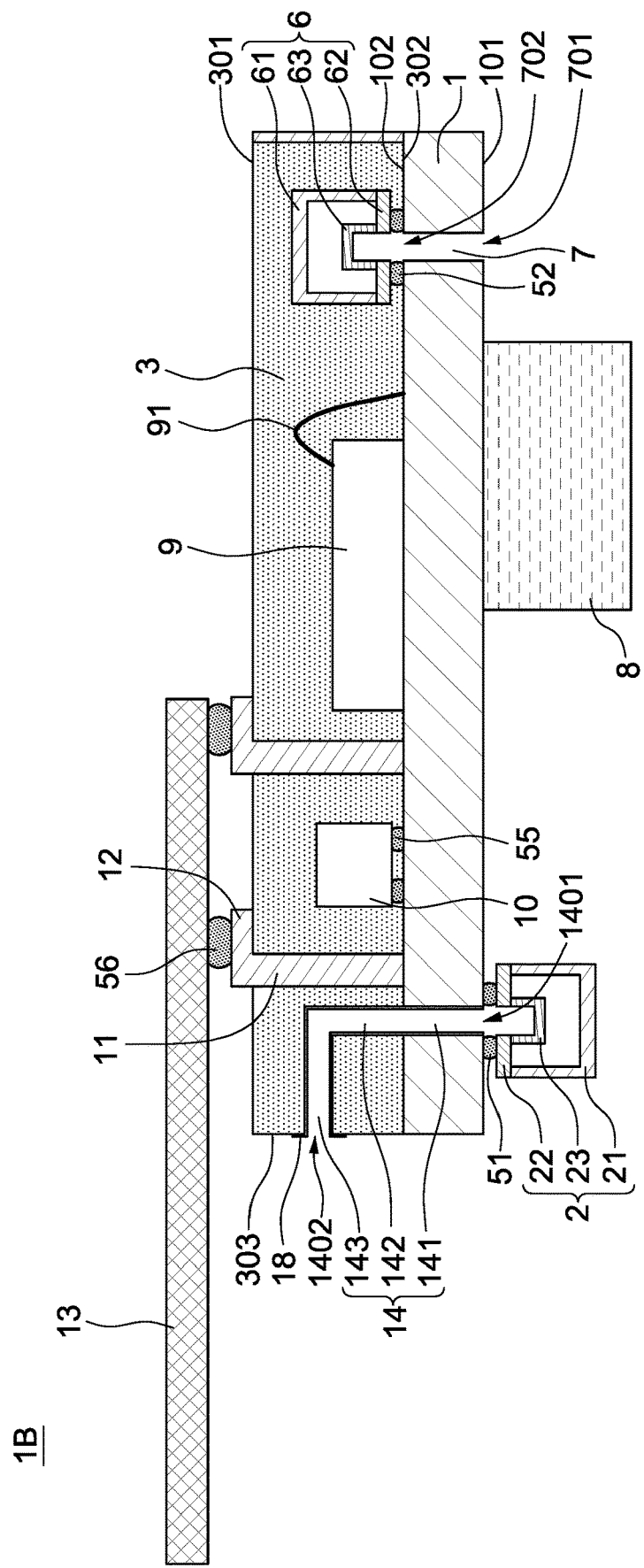
FIG. 3 illustrates a cross-sectional view of a semiconductor package device according to some embodiments of the present disclosure.

FIG. 3 illustrates a cross-sectional view of a semiconductor package device 1B according to some embodiments of the present disclosure. The semiconductor package device 1B is similar to the semiconductor package device 1A in FIG. 1, except that the semiconductor package device 1B includes a first hole 14, instead of the first hole 4 of the semiconductor package device 1A. The first hole 14 has a first end 1401 adjacent to the first surface 101. The first dielectric layer 3 has a lateral surface 303 extending from the third surface 301 to the fourth surface 302. The first hole 14 has a second end 1402 adjacent to the lateral surface 303. The first hole 14 includes a first section 141 extending through the substrate 1. The first section 141 may be substantially aligned with the first electronic component 2. The first hole 14 includes a second section 142 exposed from the fourth surface 302 and a third section 143 exposed from the lateral surface 303. The second section 142 and the third section 143 are connected within the first dielectric layer 3.

A sidewall of the second section 142 and a sidewall of the third section 143 may form an acute, right, or obtuse angle. A sidewall of the first section 141 and the sidewall of the second section 142 may be smoothly connected. The first electronic component 2 may thereby receive or detect at least one physical signal from at least one external signal source beside the semiconductor package device 1A. For example, the first electronic component 2 and the first hole 14 are configured to receive an audio signal generated by a user for the semiconductor package device 1B, whereas the second electronic component 6 and the second hole 7 are configured to receive an audio signal generated by the environment. In some embodiment, the semiconductor package device 1B may include a dielectric layer dispose on the first surface 101, and the first electronic component 2 or the antenna 8 may be encapsulated. In some embodiment, the dielectric layer may be formed in a selective molding process, and expose the second hole 7 or portion of the first surface 101.

In some embodiment, the first hole 14 may include multiple sections within the substrate 1. The multiple sections may be connected. Sidewalls of the multiple sections may form an acute, right, or obtuse angle.

Figure 4:
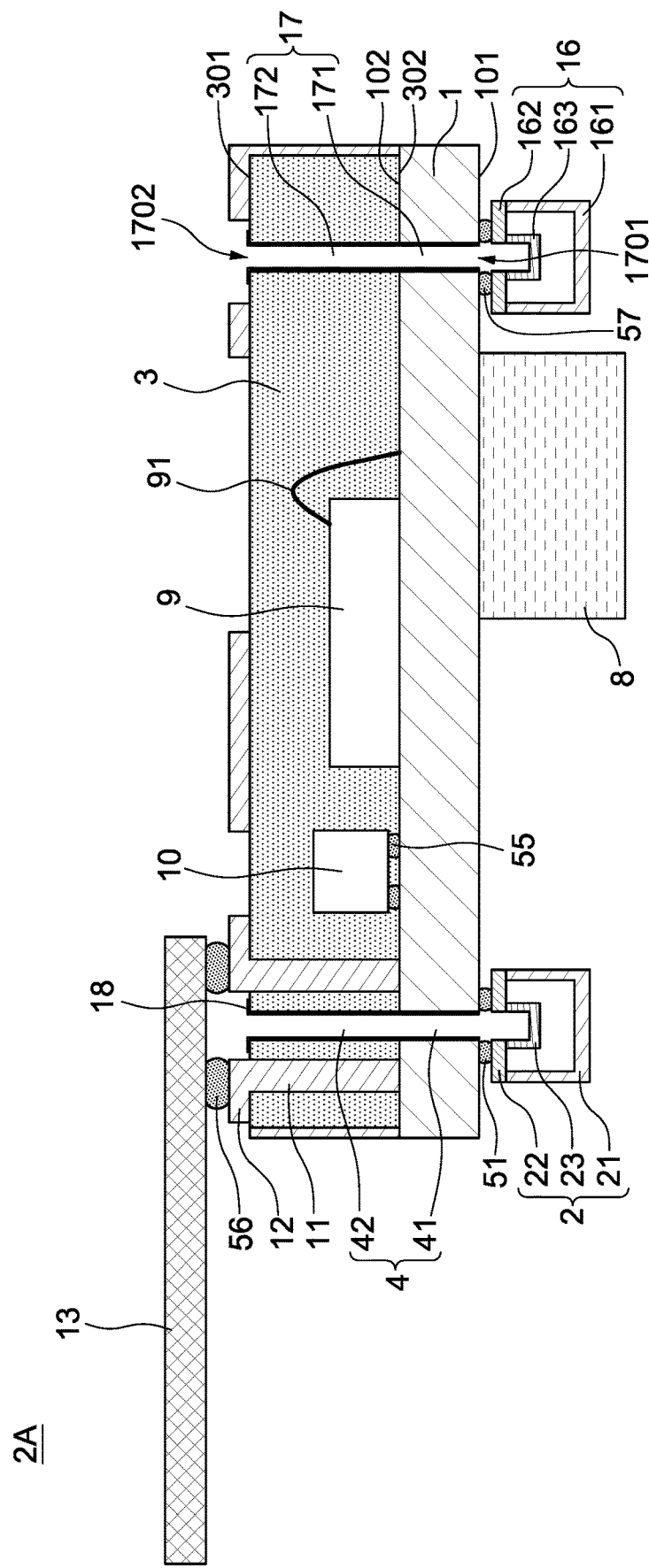
FIG. 4 illustrates a cross-sectional view of a semiconductor package device according to some embodiments of the present disclosure.

FIG. 4 illustrates a cross-sectional view of a semiconductor package device 2A according to some embodiments of the present disclosure. The semiconductor package device 2A is similar to the semiconductor package device 1A in FIG. 1, except that the semiconductor package device 2A includes a second electronic component 16 and a second hole 17, instead of the second electronic component 6 and the second hole 7 of the semiconductor package device 1A. The second electronic component 16 is disposed on the first surface 101. A connection element 57 is disposed between the second electronic component 16 and the first surface 101. The second electronic component 16 includes a housing 161, a base 162, and an active side 163. The second electronic component 16 may be similar to the first electronic component 2. The second electronic component 16 may be different from the first electronic component 2. The second hole 17 extends through the first dielectric layer 3 and the substrate 1. The second hole 17 extends from the third surface 301 to the first surface 101. The second hole 17 includes a first section 171 within the substrate 1 and a second section 172 within the first dielectric layer 3. The second hole 17 is substantially aligned with the second electronic component 16, such that the second electronic component 16 may efficiently receive or detect at least one physical signal through the second hole 7. Furthermore, a second end 1702 of the second hole 17 may face at least one external signal source to further facilitate transmission of the physical signal. The first electronic component 2 and the second electronic component 16 may receive or detect a same kind of physical signal but generated by different signal sources. For example, the first electronic component 2 and the first hole 4 are configured to receive an audio signal generated by a user for the semiconductor package device 2A, whereas the second electronic component 16 and the second hole 17 are configured to receive an audio signal generated by the environment.

Figure 5:
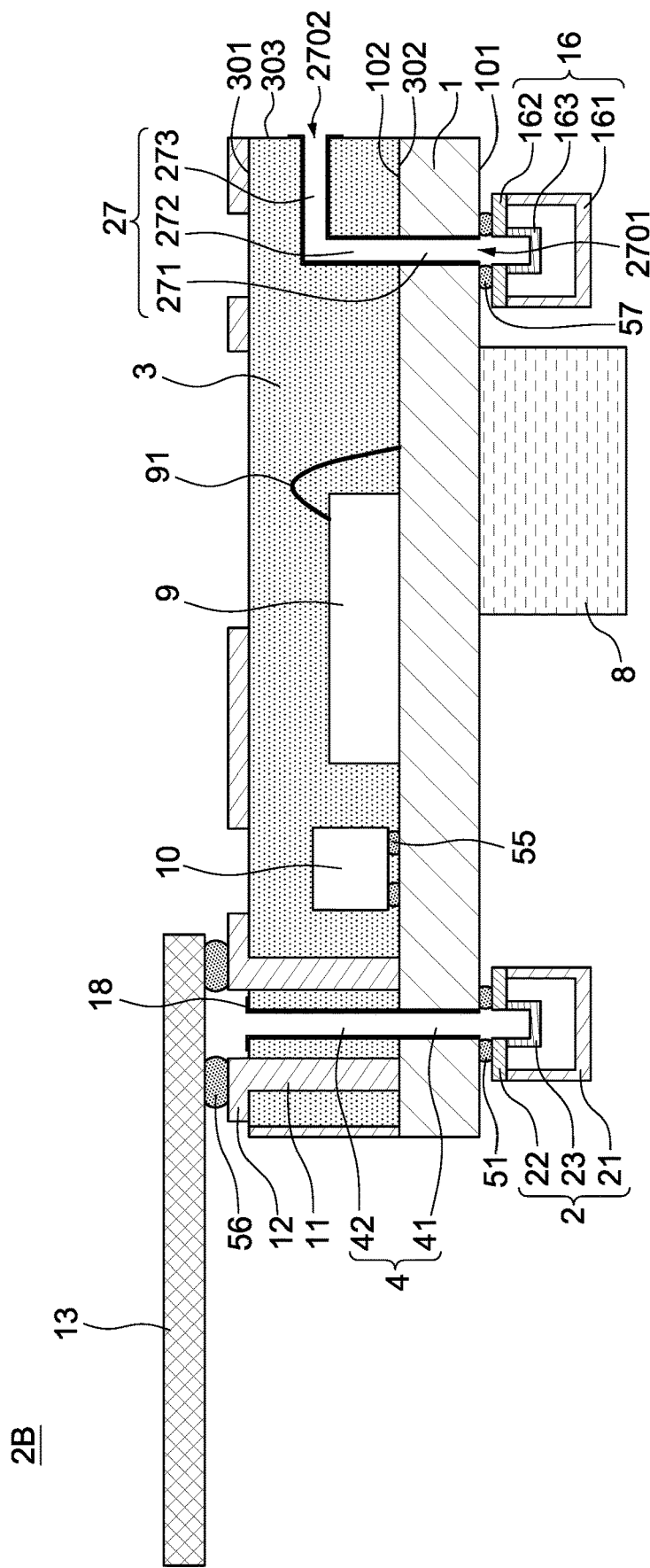
FIG. 5 illustrates a cross-sectional view of a semiconductor package device according to some embodiments of the present disclosure.

FIG. 5 illustrates a cross-sectional view of a semiconductor package device 2B according to some embodiments of the present disclosure. The semiconductor package device 2B is similar to the semiconductor package device 2A in FIG. 4, except that the semiconductor package device 2B includes a second hole 27, instead of the second hole 17 of the semiconductor package device 2A. The second hole 27 has a first end 2701 adjacent to the first surface 101 and a second end 2702 adjacent to the lateral surface 303 of the first dielectric layer 3. The first hole 27 includes a first section 271 extending through the substrate 1. The first section 271 may be substantially aligned with the second electronic component 16. The second hole 27 includes a second section 272 exposed from the fourth surface 302 and a third section 273 exposed from the lateral surface 303. The second section 272 and the third section 273 are connected within the first dielectric layer 3. The third section 273 may be parallel to the second surface 102. A sidewall of the second section 272 and a sidewall of the third section 273 may form an acute, right, or obtuse angle. A sidewall of the first section 271 and the sidewall of the second section 272 may be smoothly connected. Therefore, the second electronic component 16 may receive or detect at least one physical signal from at least one external signal source beside the semiconductor package device 1A. For example, the first electronic component 2 and the first hole 4 are configured to receive an audio signal generated by the environment, whereas the second electronic component 16 and the second hole 27 are configured to receive an audio signal generated by a user for the semiconductor package device 2B.

Figure 6:
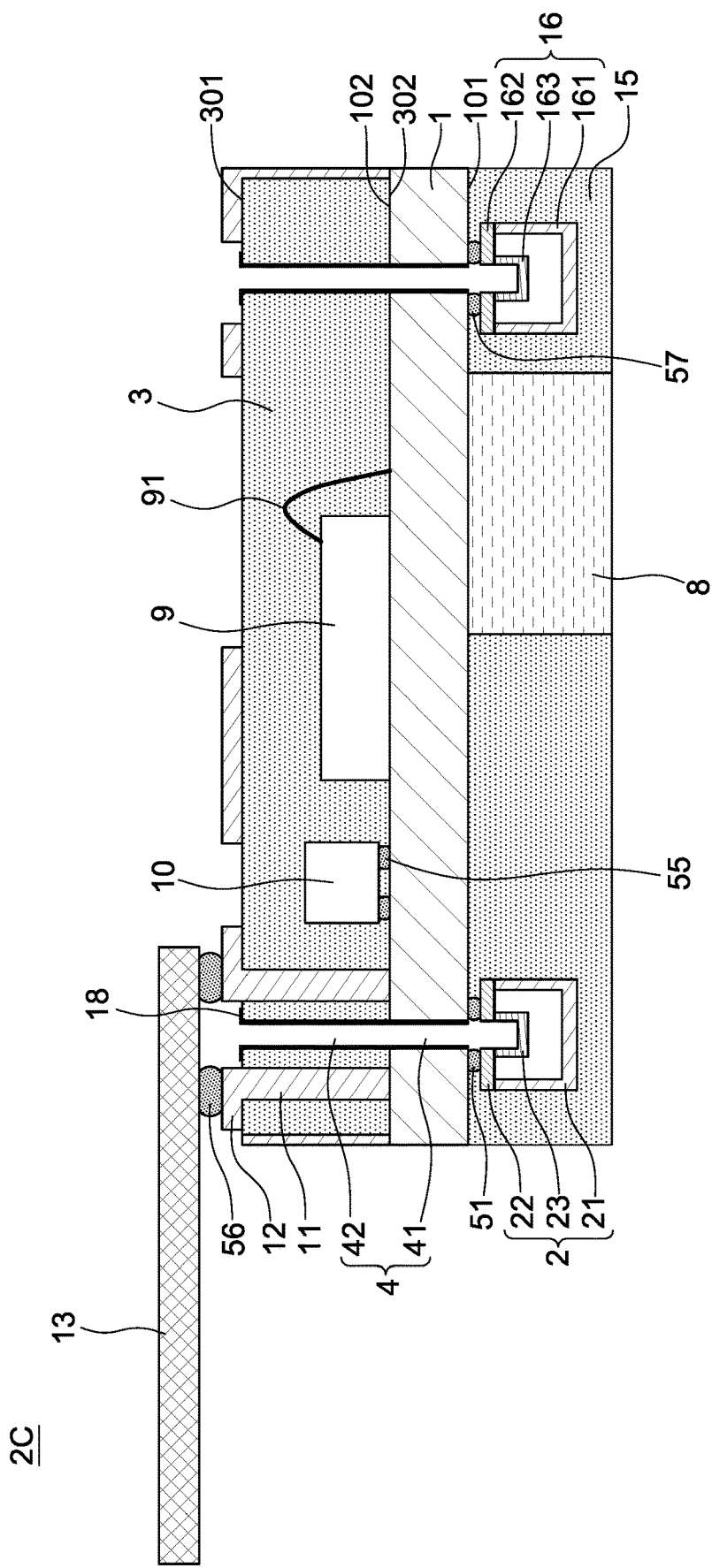
FIG. 6 illustrates a cross-sectional view of a semiconductor package device according to some embodiments of the present disclosure.

FIG. 6 illustrates a cross-sectional view of a semiconductor package device 2C according to some embodiments of the present disclosure. The semiconductor package device 2C is similar to the semiconductor package device 2B in FIG. 5, except that the semiconductor package device 2C further includes a second dielectric layer 15 disposed on the first surface 101 of the substrate 1. The first electronic component 2 and/or the second electronic component 16 are covered by the second dielectric layer 15. The antenna 8 is surrounded by the second dielectric layer 15. The antenna 8 may have a surface exposed from the second dielectric layer 15. The second dielectric layer 15 helps firmly hold the first electronic component 2, the second electronic component 16, and/or antenna 8. In an alternative embodiment, the antenna 8 may be enclosed by the second dielectric layer 2. The antenna 8 may have a surface away from the substrate 1 and covered by the second dielectric layer 2.

In some embodiments, more electronic components may be disposed on the first surface 101 or the second surface 102 and configured to receive or detect at least one physical signal from the environment. In some embodiments, more semiconductor dies, devices may be disposed on surface 101 or the second surface 102 and electrically connected to the substrate 1.

FIG. 7 through FIG. 14 illustrate a method for manufacturing a semiconductor package device according to some embodiments of the present disclosure. In some embodiments, the method is for manufacturing the semiconductor package device 1A shown in FIG. 1.

Figure 7:
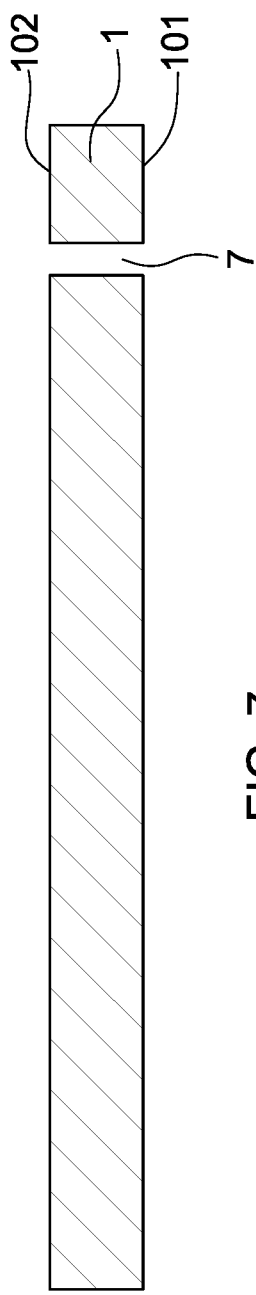
FIG. 7 illustrates one or more stages of an example of a method for manufacturing a semiconductor package device according to some embodiments of the present disclosure.

Referring to FIG. 7, a substrate 1 is provided. The substrate has a first surface 101 and a second surface opposite to the first surface 102. The substrate includes a second hole 7 extending from the first surface 101 to the second surface 102. In some embodiments, a conductive layer may be disposed along a sidewall of the second hole 7.

Figure 8:
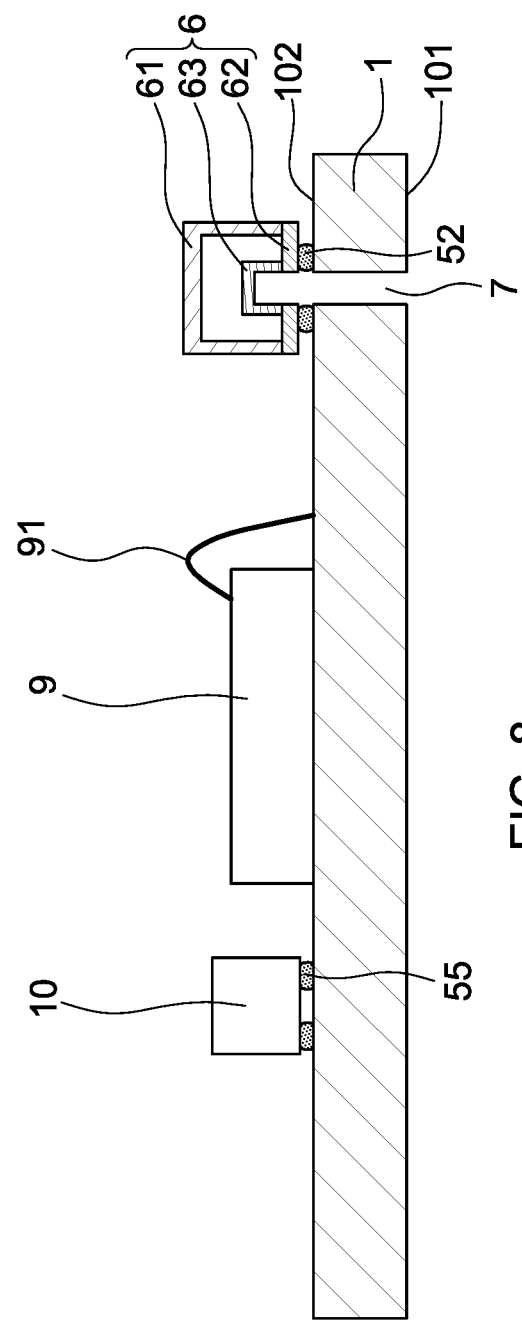
FIG. 8 illustrates one or more stages of an example of a method for manufacturing a semiconductor package device according to some embodiments of the present disclosure.

Referring to FIG. 8, a second electronic component 6 is attached to the second surface 102 through a connection element 52. The second electronic component 6 includes a housing 61, a base 62, and an active side 63. The active side 63 is substantially aligned with the second hole 7. A semiconductor die 9 is attached to the second surface 102. A bond wiring 91 is formed to electrically connect the semiconductor die 9 and the substrate 1. A device 10 is attached to the second surface 102 through a connection element 55.

Figure 9:
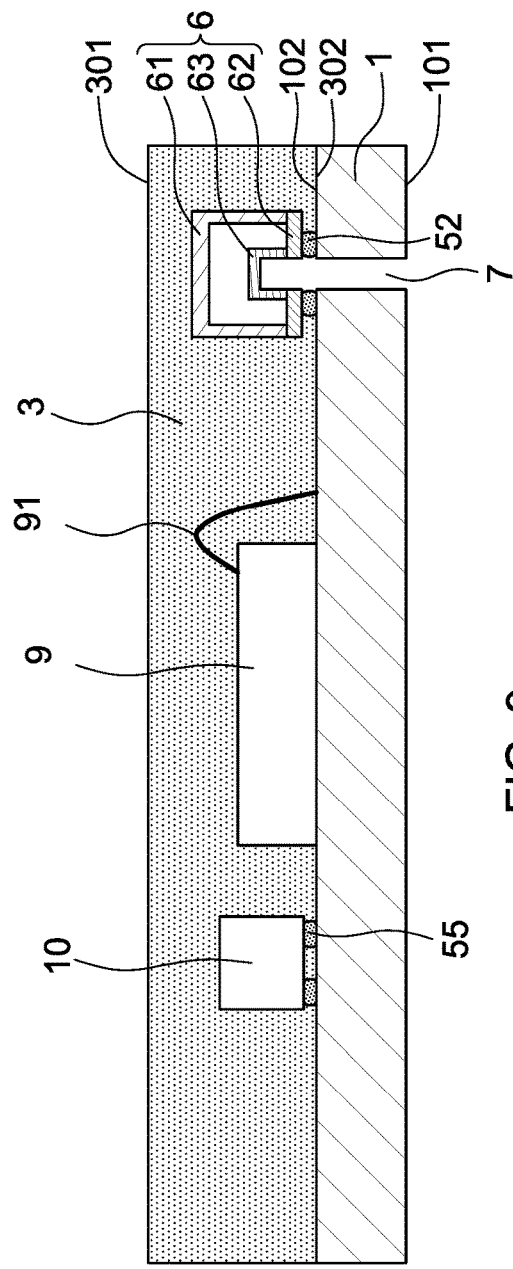
FIG. 9 illustrates one or more stages of an example of a method for manufacturing a semiconductor package device according to some embodiments of the present disclosure.

Referring to FIG. 9, a first dielectric layer 3 is formed on the second surface 102. The first dielectric layer 3 has a third surface 301 away from the substrate 1 and a fourth surface 302 toward the substrate 1. The first dielectric layer 3 may cover the second electronic component 6, the semiconductor die 9, the bond wiring 91, and/or the device 10. The connection element 52 is configured to prevent the material of the first dielectric layer 3 from entering the second hole 7.

Figure 10:
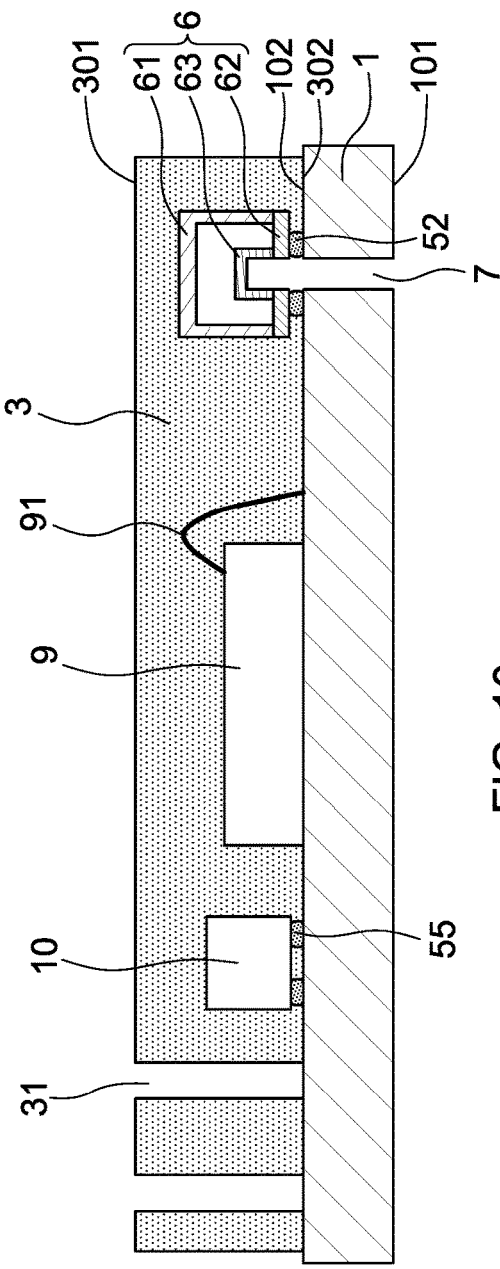
FIG. 10 illustrates one or more stages of an example of a method for manufacturing a semiconductor package device according to some embodiments of the present disclosure.
Figure 11:
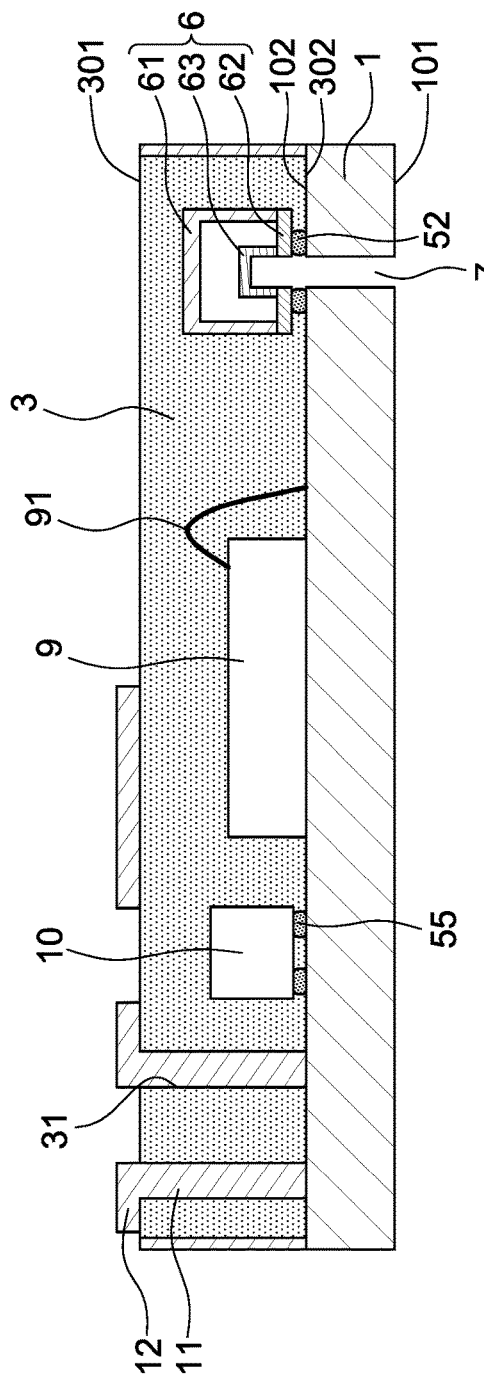
FIG. 11 illustrates one or more stages of an example of a method for manufacturing a semiconductor package device according to some embodiments of the present disclosure.

Referring to FIG. 10, the first dielectric layer 3 is etched to form a plurality of openings 31 by, for example, a mechanical drilling process or a laser ablation process. Referring to FIG. 11, a through via 11 is formed within the plurality of openings 31 and a conductive layer 12 is formed on the third surface 301 by, for example, a sputter process or an electroplating process followed by a patterning and an etching process.

Figure 12:
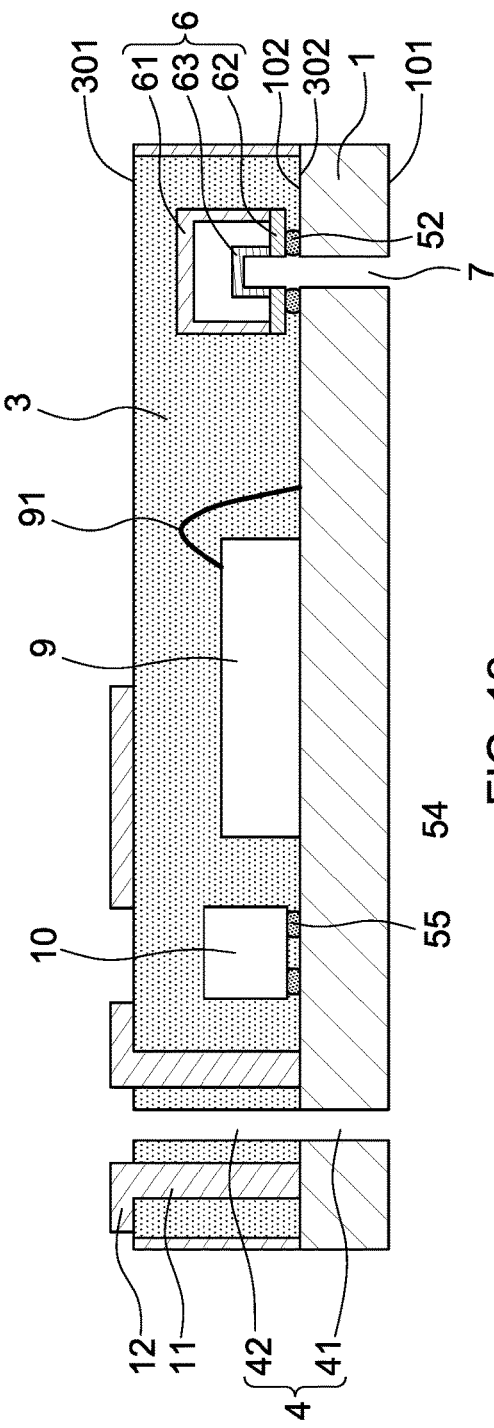
FIG. 12 illustrates one or more stages of an example of a method for manufacturing a semiconductor package device according to some embodiments of the present disclosure.

Referring to FIG. 12, the first dielectric layer 3 and the substrate 1 is etched to form a first hole 4 by, for example, at least one mechanical drilling process or at least one laser ablation process. The first hole extends from the third surface 301 to the first surface 101. The first hole 4 includes a first section 41 within the substrate 1 and a second section 42 within the first dielectric layer 3. A sidewall of the first section 41 and a sidewall of the second section 42 may be smoothly connected.

Figure 13:
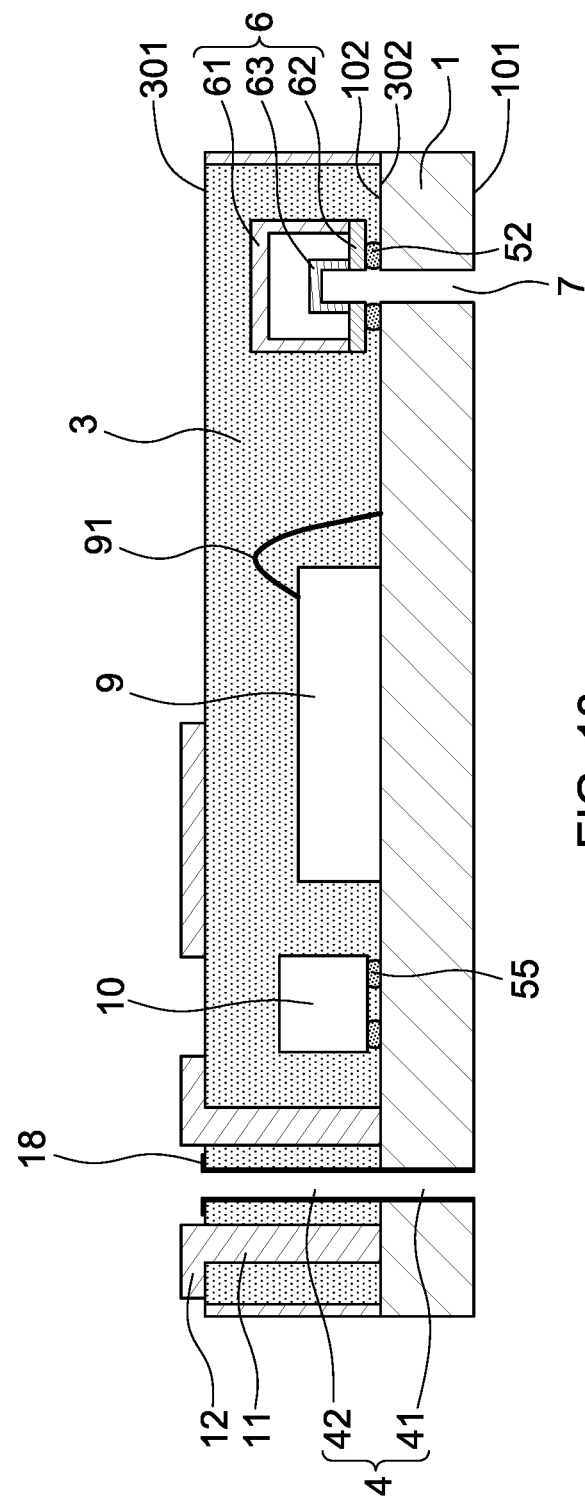
FIG. 13 illustrates one or more stages of an example of a method for manufacturing a semiconductor package device according to some embodiments of the present disclosure.

Referring to FIG. 13, a reflection layer 18 is formed on the third surface 301 and along the sidewall of the first hole 4 by, for example, a physical vapor deposition (PVD), or an electroplating process. The reflection layer 18 may include a seed layer in contact with the first dielectric layer 3 or the substrate 1.

Figure 14:
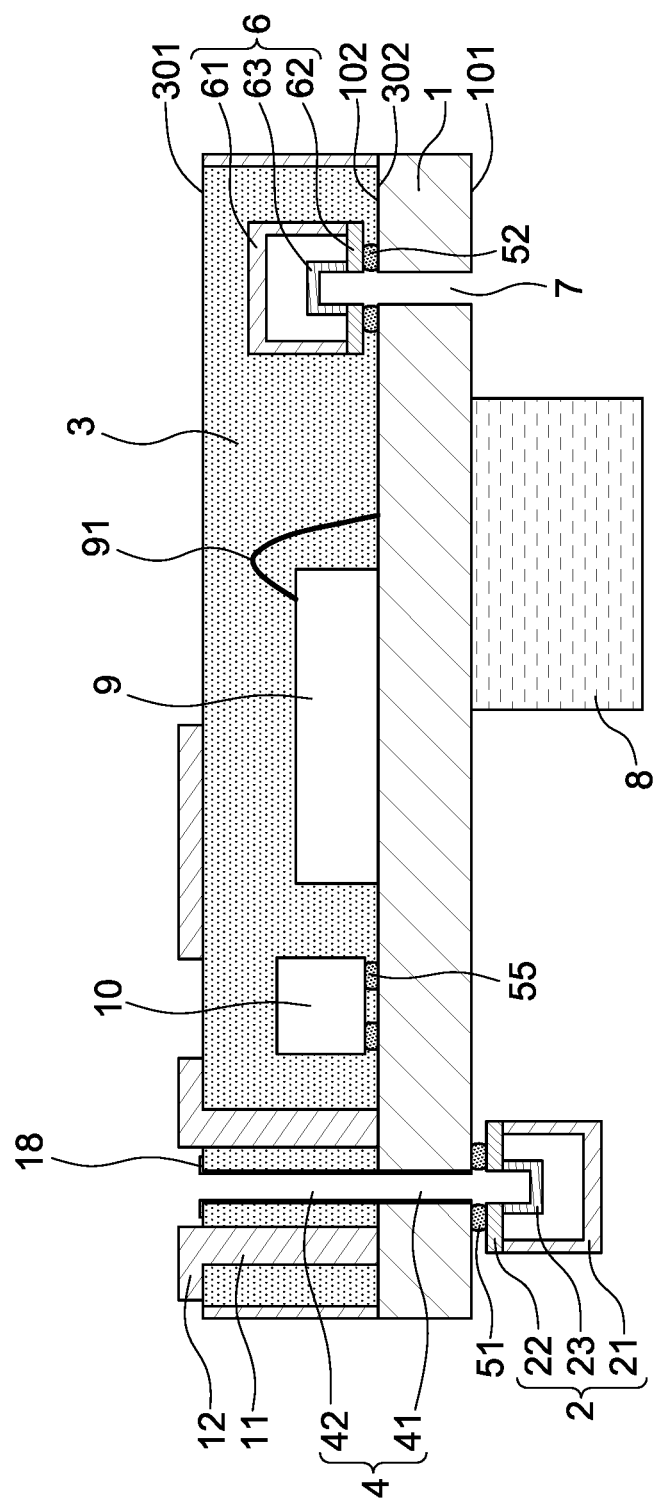
FIG. 14 illustrates one or more stages of an example of a method for manufacturing a semiconductor package device according to some embodiments of the present disclosure.

Referring to FIG. 14, a first electronic component 2 is attached to the first surface 101 through a connection element 51. The first electronic component 2 includes a housing 21, a base 22, and an active side 23. The active side 23 is substantially aligned with the first hole 4. Still referring to FIG. 14, an antenna 8 is attached to the first surface 101. Afterwards, singulation may be performed and a flexible substrate 13 bonded to form the semiconductor package device 1A as illustrated in FIG. 1A.

FIG. 15 through FIG. 22 illustrate a method for manufacturing a semiconductor package device according to some embodiments of the present disclosure. In some embodiments, the method is for manufacturing the semiconductor package device 2A shown in FIG. 3.

Figure 15:
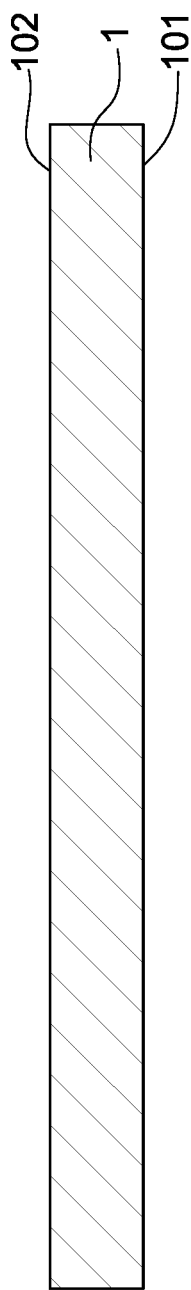
FIG. 15 illustrates one or more stages of an example of a method for manufacturing a semiconductor package device according to some embodiments of the present disclosure.
Figure 16:
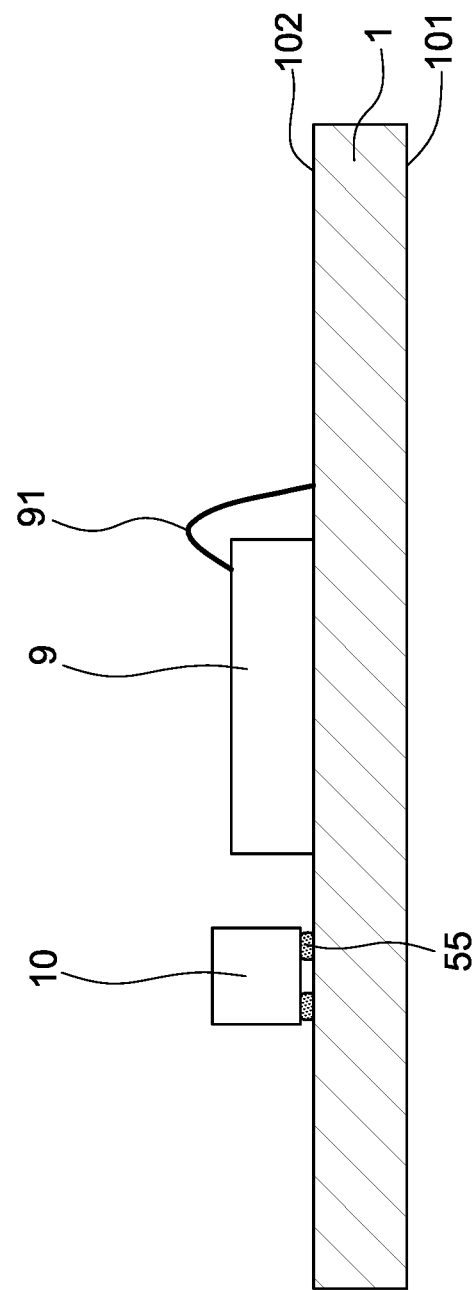
FIG. 16 illustrates one or more stages of an example of a method for manufacturing a semiconductor package device according to some embodiments of the present disclosure.
Figure 17:
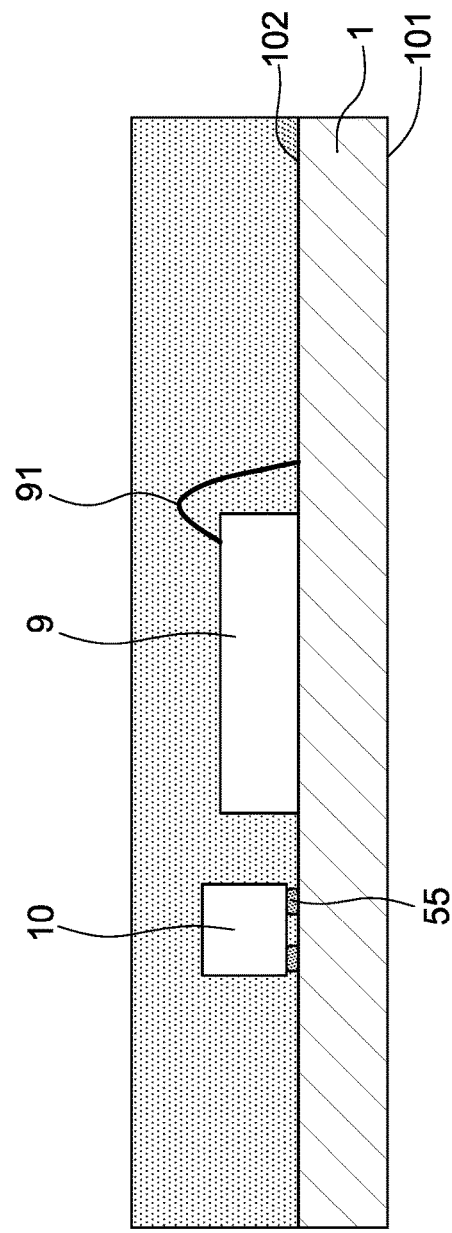
FIG. 17 illustrates one or more stages of an example of a method for manufacturing a semiconductor package device according to some embodiments of the present disclosure.

Referring to FIG. 15, a substrate 1 is provided. The substrate has a first surface 101 and a second surface opposite to the first surface 102. Referring to FIG. 16, a semiconductor die 9 is attached to the second surface 102. A bond wiring 91 is formed to electrically connect the semiconductor die 9 and the substrate 1. A device 10 is attached to the second surface 102 through a connection element 55. Referring to FIG. 17, a first dielectric layer 3 is formed on the second surface 102. The first dielectric layer 3 has a third surface 301 away from the substrate 1 and a fourth surface 302 toward the substrate 1. The first dielectric layer 3 may cover the semiconductor die 9, the bond wiring 91, and/or the device 10.

Figure 18:
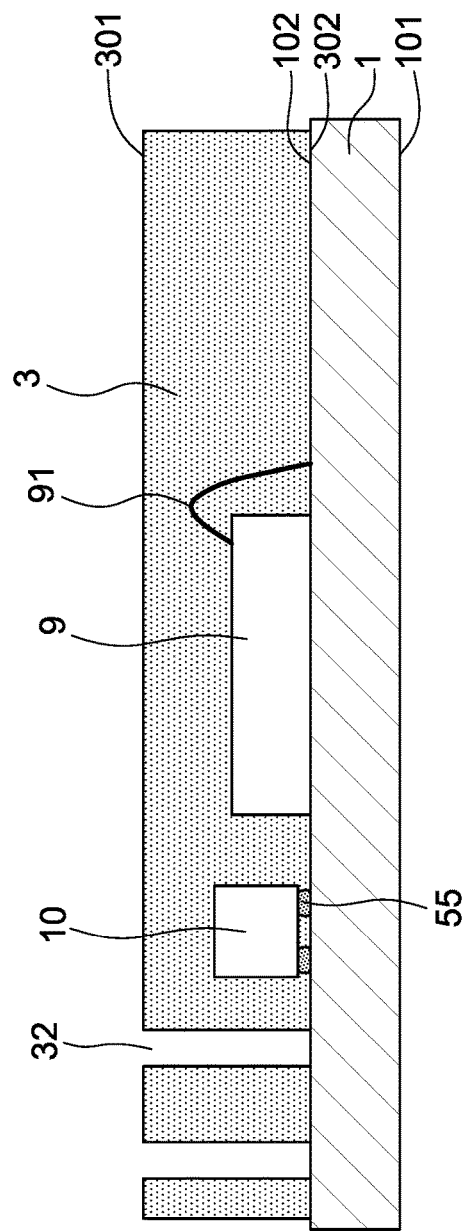
FIG. 18 illustrates one or more stages of an example of a method for manufacturing a semiconductor package device according to some embodiments of the present disclosure.
Figure 19:
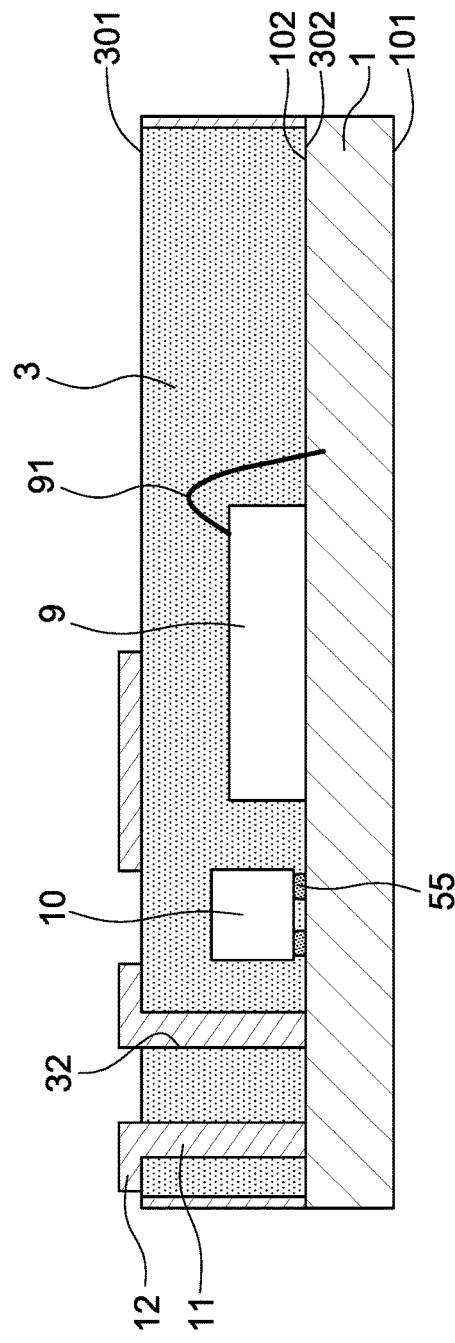
FIG. 19 illustrates one or more stages of an example of a method for manufacturing a semiconductor package device according to some embodiments of the present disclosure.

Referring to FIG. 18, the first dielectric layer 3 is etched to form a plurality of openings 32 by, for example, a mechanical drilling process or a laser ablation process. Referring to FIG. 19, a through via 11 is formed within the plurality of openings 32 and a conductive layer 12 is formed on the third surface 301 by, for example, a sputter process or an electroplating process followed by a patterning and an etching process.

Figure 20:
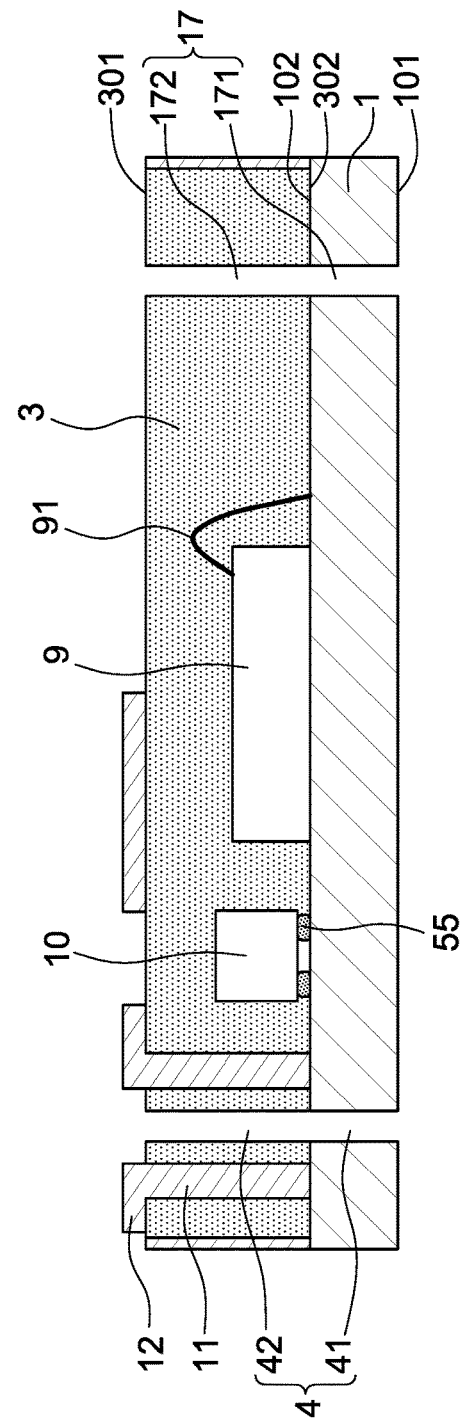
FIG. 20 illustrates one or more stages of an example of a method for manufacturing a semiconductor package device according to some embodiments of the present disclosure.

Referring to FIG. 20, the first dielectric layer 3 and the substrate 1 is etched to form a first hole 4 and a second hole 17 by, for example, at least one mechanical drilling process or at least one laser ablation process. The first hole 4 and the second hole 17 each extends from the third surface 301 to the first surface 101. The first hole 4 includes a first section 41 within the substrate 1 and a second section 42 within the first dielectric layer 3. A sidewall of the first section 41 and a sidewall of the second section 42 may be smoothly connected. The second hole 17 includes a first section 171 within the substrate 1 and a second section 172 within the first dielectric layer 3. A sidewall of the first section 171 and a sidewall of the second section 172 may be smoothly connected.

Figure 21:
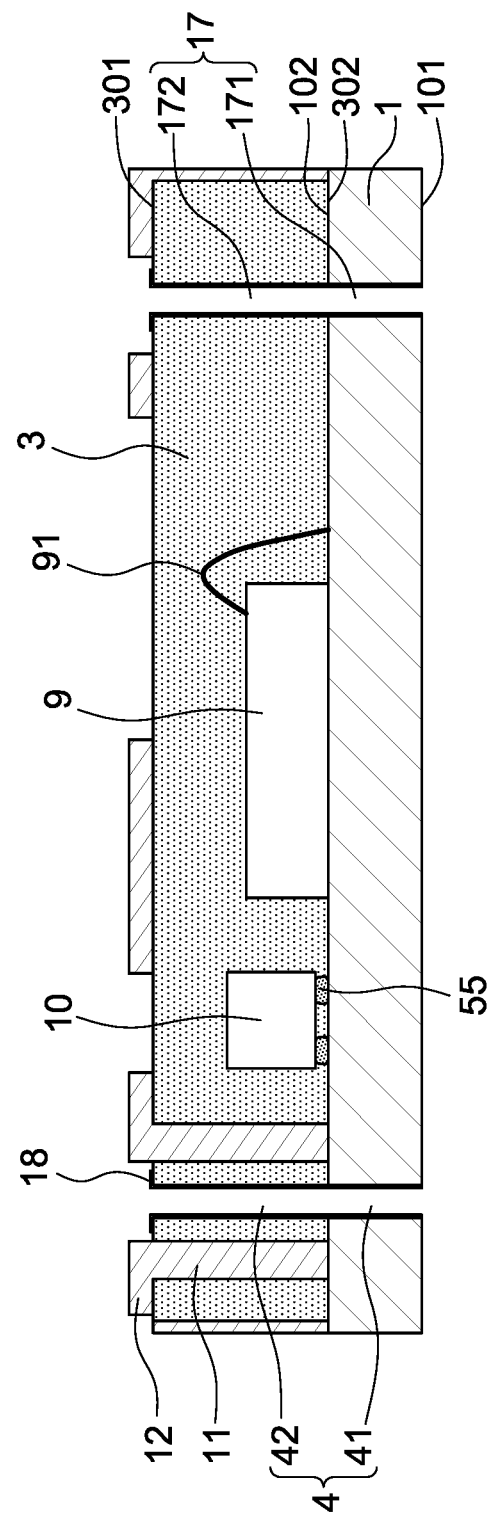
FIG. 21 illustrates one or more stages of an example of a method for manufacturing a semiconductor package device according to some embodiments of the present disclosure.

Referring to FIG. 21, a reflection layer 18 is formed on the third surface 301 and along the sidewall of the first hole 4 and the sidewall of the second hole 17 by, for example, a PVD, or an electroplating process. The reflection layer 18 may include a seed layer in contact with the first dielectric layer 3 or the substrate 1.

Figure 22:
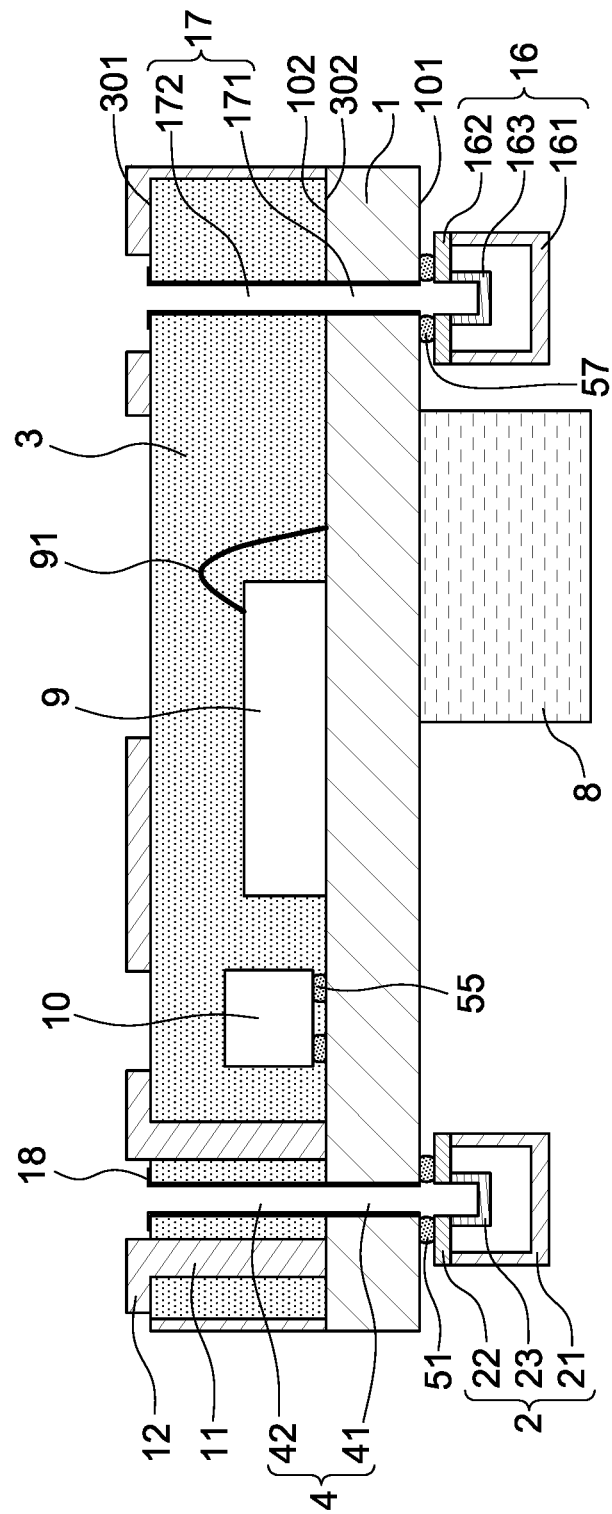
FIG. 22 illustrates one or more stages of an example of a method for manufacturing a semiconductor package device according to some embodiments of the present disclosure.

Referring to FIG. 22, a first electronic component 2 is attached to the first surface 101 through a connection element 51. The first electronic component 2 includes a housing 21, a base 22, and an active side 23. The active side 23 is substantially aligned with the first hole 4. Furthermore, a second electronic component 16 is attached to the first surface 101 through a connection element 57. The second electronic component 16 includes a housing 161, a base 162, and an active side 163. Still referring to FIG. 22, an antenna 8 is attached to the first surface 101. Afterwards, singulation may be performed and a flexible substrate 13 bonded to form the semiconductor package device 2A as illustrated in FIG. 2A.

Figure 23:
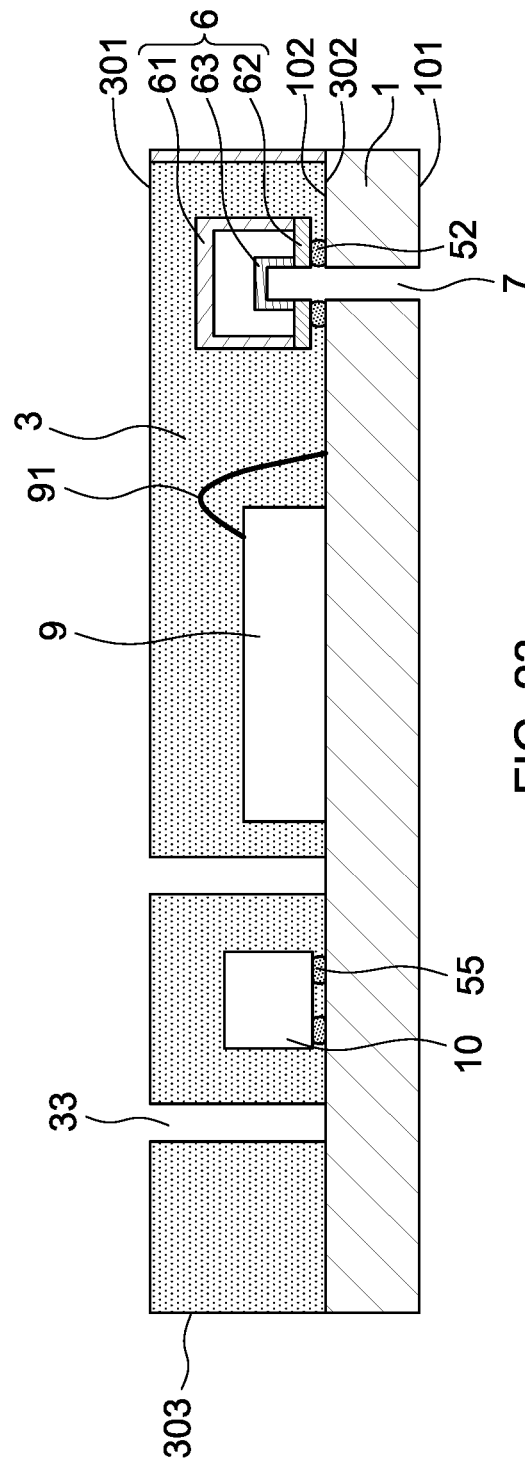
FIG. 23 illustrates one or more stages of an example of a method for manufacturing a semiconductor package device according to some embodiments of the present disclosure.
Figure 24:
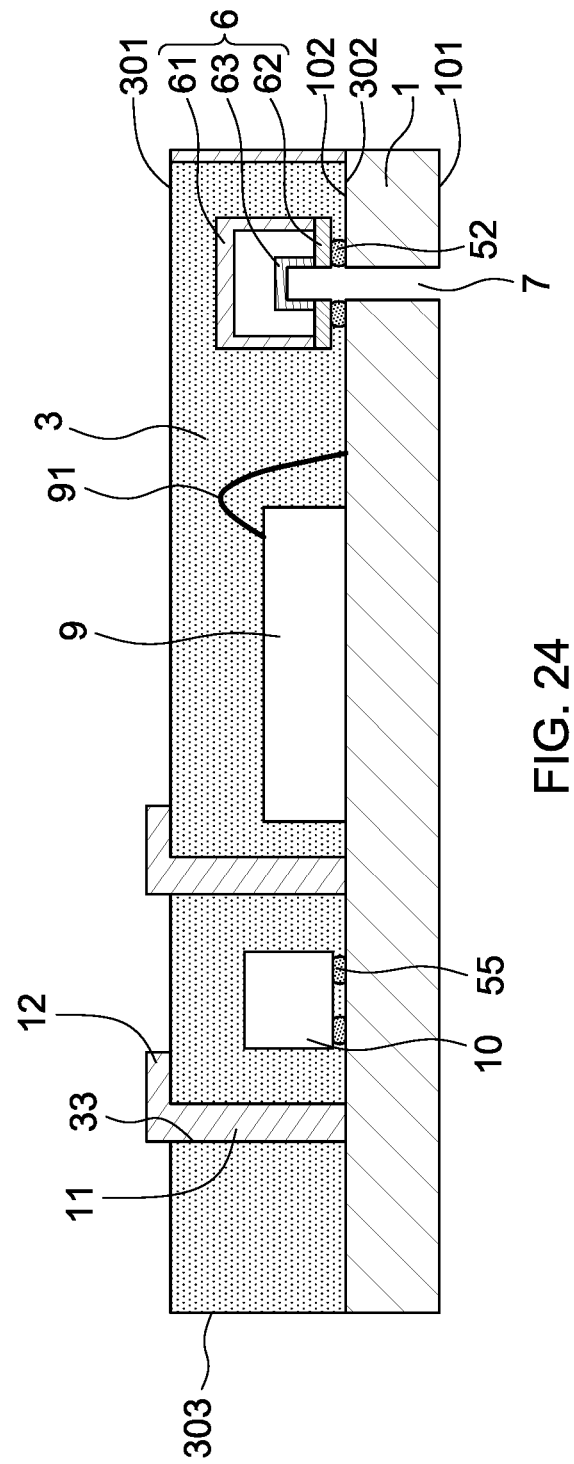
FIG. 24 illustrates one or more stages of an example of a method for manufacturing a semiconductor package device according to some embodiments of the present disclosure.
Figure 25:
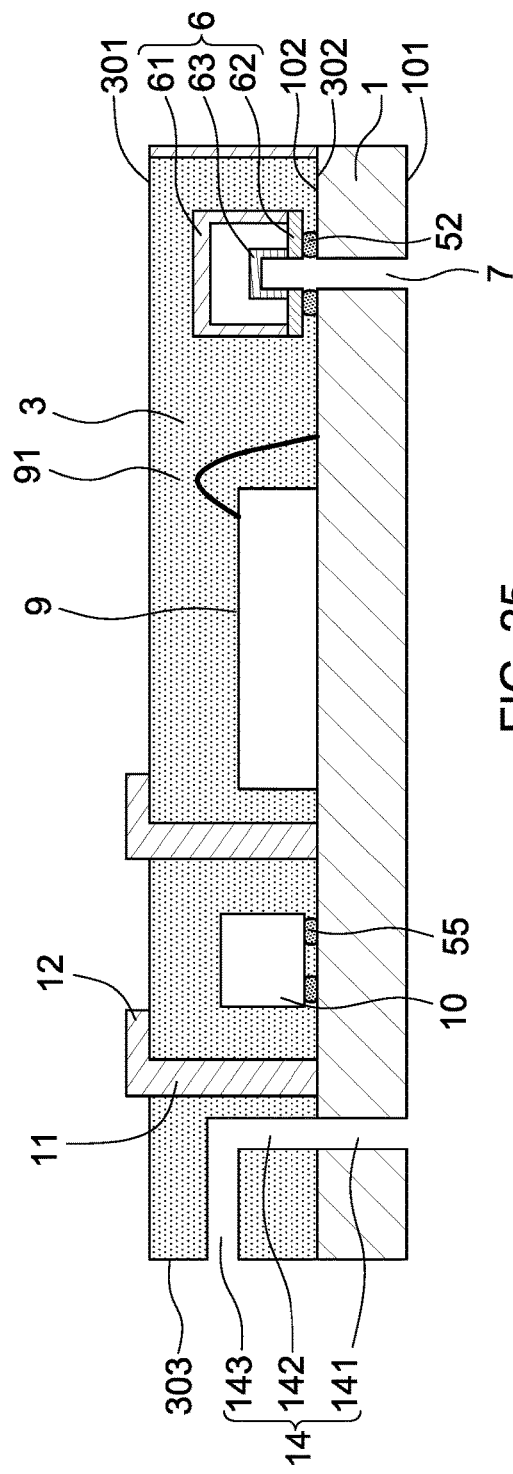
FIG. 25 illustrates one or more stages of an example of a method for manufacturing a semiconductor package device according to some embodiments of the present disclosure.

FIG. 23 through FIG. 25 illustrate one or more stages of an example of a method for manufacturing a semiconductor package device according to some embodiments of the present disclosure. In some embodiments, the method is for manufacturing the semiconductor package device 1B shown in FIG. 3. The initial stages of the illustrated process are the same as, or similar to, the stages illustrated in FIG. 7 to FIG. 9. FIG. 23 depicts a stage subsequent to that depicted in FIG. 9.

Referring to FIG. 23, the first dielectric layer 3 is etched to form a plurality of openings 33 by, for example, a mechanical drilling process or a laser ablation process. Referring to FIG. 24, a through via 11 is formed within the plurality of openings 33 and a conductive layer 12 is formed on the third surface 301 by, for example, a sputter process or an electroplating process followed by a patterning and an etching process.

Referring to FIG. 25, the first dielectric layer 3 is etched to form a first hole 14 by, for example, at least one mechanical drilling process or at least one laser ablation processes. The first hole 14 includes a first section 141 within the substrate 1, a second section 142 within the first dielectric layer and connected to the first section 141, and a third section 143 exposed from the lateral surface 303. The first section 141 and the second section 142 may be formed in the same laser ablation process. The third section 143 may be formed in another laser ablation process before or after the formation of the first section 141 and the second section 142. The first section 141 and the second section 142 may be formed in the same mechanical drilling process. The third section 143 may be formed in another mechanical drilling process before or after the formation of the first section 141 and the second section 142. Afterwards, similar steps to those illustrated in FIGS. 13 and 14 and singulation may be performed and a flexible substrate 13 may be bonded to form the semiconductor package device 1B as illustrated in FIG. 3.

Figure 26:
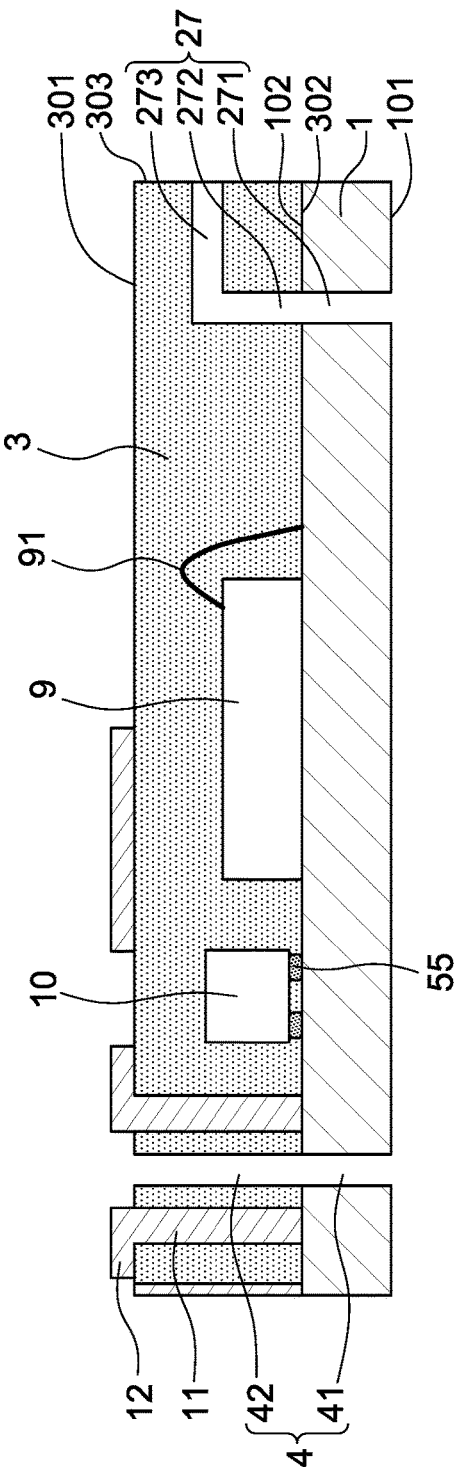
FIG. 26 illustrates one or more stages of an example of a method for manufacturing a semiconductor package device according to some embodiments of the present disclosure.

FIG. 26 illustrates one or more stages of an example of a method for manufacturing a semiconductor package device according to some embodiments of the present disclosure. In some embodiments, the method is for manufacturing the semiconductor package device 2B shown in FIG. 5. The initial stages of the illustrated process are the same as, or similar to, the stages illustrated in FIG. 15 to FIG. 19. FIG. 26 depicts a stage subsequent to that depicted in FIG. 19.

Referring to FIG. 26, the first dielectric layer 3 is etched to form a first hole 4 by, for example, a mechanical drilling process or a laser ablation processes. The first hole 4 includes a first section 41 within the substrate 1, a second section 42 within the first dielectric layer 3. A sidewall of the first section 41 and a sidewall of the second section 42 may be smoothly connected. Still referring to FIG. 26, the first dielectric layer 3 is etched to form a second hole 27 by, for example, at least one mechanical drilling process or at least one laser ablation processes. The second hole 27 includes a first section 271 within the substrate 1, a second section 272 within the first dielectric layer 3 and connected to the first section 271, and a third section 273 exposed from the lateral surface 303. The first section 271 and the second section 272 may be formed in the same mechanical drilling process. The third section 273 may be formed in another mechanical drilling process before or after the formation of the first section 271 and the second section 272. The first section 271 and the second section 272 may be formed in the same laser ablation process. The third section 273 may be formed in another laser ablation process before or after the formation of the first section 271 and the second section 272. Afterwards, similar steps as illustrated in FIGS. 21 and 22 and singulation may be performed and a flexible substrate 13 may be bonded to form the semiconductor package device 2B as illustrated in FIG. 5.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package device, comprising:
    a substrate having a first surface and a second surface opposite to the first surface;
    a first electronic component disposed on the first surface;
    a first dielectric layer disposed on the second surface and having a third surface away from the substrate;
    a first hole extending through the first dielectric layer and the substrate; and a plurality of through vias in the first dielectric layer, wherein the plurality of through vias are electrically connected to the substrate,
wherein the first hole is substantially aligned with the first electronic component.

2. The semiconductor package device of claim 1, further comprising:
a second electronic component disposed on the first surface; and
a second hole extending from the third surface to the first surface,
wherein the second hole is substantially aligned with the second electronic component.

3. The semiconductor package device of claim 1, the first hole having two ends, one end is adjacent to a lateral surface of the first dielectric layer and the other end is adjacent to the first surface.

4. The semiconductor package device of claim 1, further comprising a second dielectric layer disposed on the first surface, wherein the first electronic component is covered by the second dielectric layer.

5. The semiconductor package device of claim 1, further comprising a semiconductor die electrically connected to the substrate through a bonding wire, wherein the semiconductor die and the bonding wire are covered by the first dielectric layer.

6. The semiconductor package device of claim 1, further comprising a reflection layer disposed along a sidewall of the first hole.

7. The semiconductor package device of claim 1, wherein the first hole has a tapered profile.

8. The semiconductor package device of claim 1, wherein the first hole has a sidewall substantially perpendicular to the third surface.

9. The semiconductor package device of claim 1, wherein the first electronic component is a microelectromechanical systems (MEMS) device.

10. A method of manufacturing a semiconductor package device, comprising:
providing a substrate having a first surface and a second surface opposite to the first surface;
forming a first dielectric layer on the second surface and the first dielectric layer having a third surface away from the substrate;
forming a first hole extending from the third surface to the first surface; and
disposing a first electronic component on the first surface, wherein the first hole is substantially aligned with the first electronic component.

11. The method of claim 10, further comprising:
forming a second hole having two ends, one end is adjacent to a lateral surface of the first dielectric layer and the other end is adjacent to the first surface.

12. The method of claim 10, wherein forming the first hole includes removing a portion of the first dielectric layer and the substrate by laser ablation.

13. The method of claim 10, further comprising:
prior to forming the first hole, forming a second hole extending from the first surface to the second surface; and
disposing a second electronic component on the second surface to align with a second hole.

* * * * *